United States Patent [19]
Camerlenghi

[11] Patent Number: 5,241,499
[45] Date of Patent: Aug. 31, 1993

[54] NON-VOLATILE SPLIT GATE EPROM MEMORY CELL AND SELF-ALIGNED FIELD INSULATION PROCESS FOR OBTAINING THE ABOVE CELL

[75] Inventor: Emilio Camerlenghi, Bergamo, Italy

[73] Assignee: SGS-Thomson Microelectronics s.r.l., Agrate Brianza, Italy

[21] Appl. No.: 631,008

[22] Filed: Dec. 19, 1990

[30] Foreign Application Priority Data

Dec. 22, 1989 [IT] Italy .................. 22844 A/89

[51] Int. Cl.$^5$ .......................................... G11C 11/40
[52] U.S. Cl. .................. 365/189.01; 365/185; 365/51; 257/314
[58] Field of Search ............ 365/189.01, 185, 51; 357/23.5, 40

[56] References Cited
U.S. PATENT DOCUMENTS
4,300,212 11/1981 Simko .

FOREIGN PATENT DOCUMENTS
0052982 6/1982 European Pat. Off. .
0326465 1/1988 European Pat. Off. .
55-54662 12/1980 Japan .
58-92869 5/1982 Japan .

Primary Examiner—Terrell W. Fears
Attorney, Agent, or Firm—Sixbey, Friedman, Leedom & Ferguson

[57] ABSTRACT

The cell comprises a substrate with diffusions of source and drain separated by a channel area a floating gate superimposed over a first part of said channel area and a control gate formed by a first and a second polysilicon strip, respectively, a cell gate oxide between said floating gate and said first part of the channel area, a transistor gate oxide between said control gate and a second part of the channel area, an interpoly oxide between said floating gate and said control gate and a layer of dielectric filler. By means of a process which provides for self-aligned etchings of layers of polysilicon and of oxides there is obtained a floating gate and a control gate self-aligned with one another and with the diffusions of source and drain, as well as with the first oxide.

4 Claims, 5 Drawing Sheets

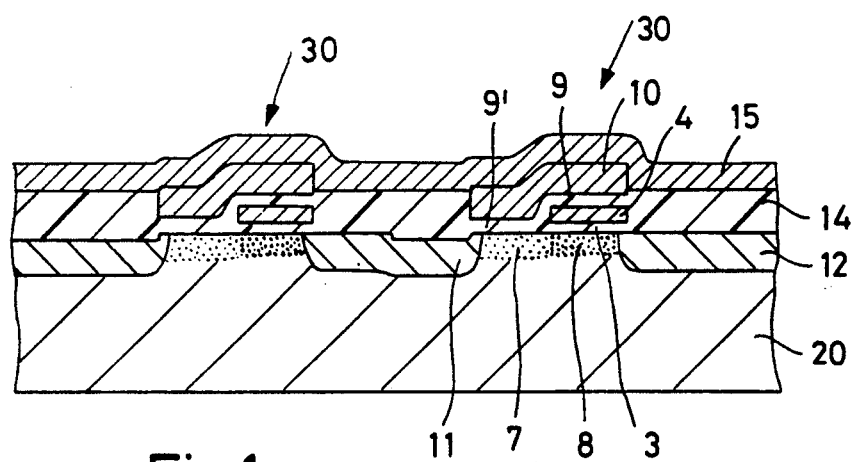
Fig.1
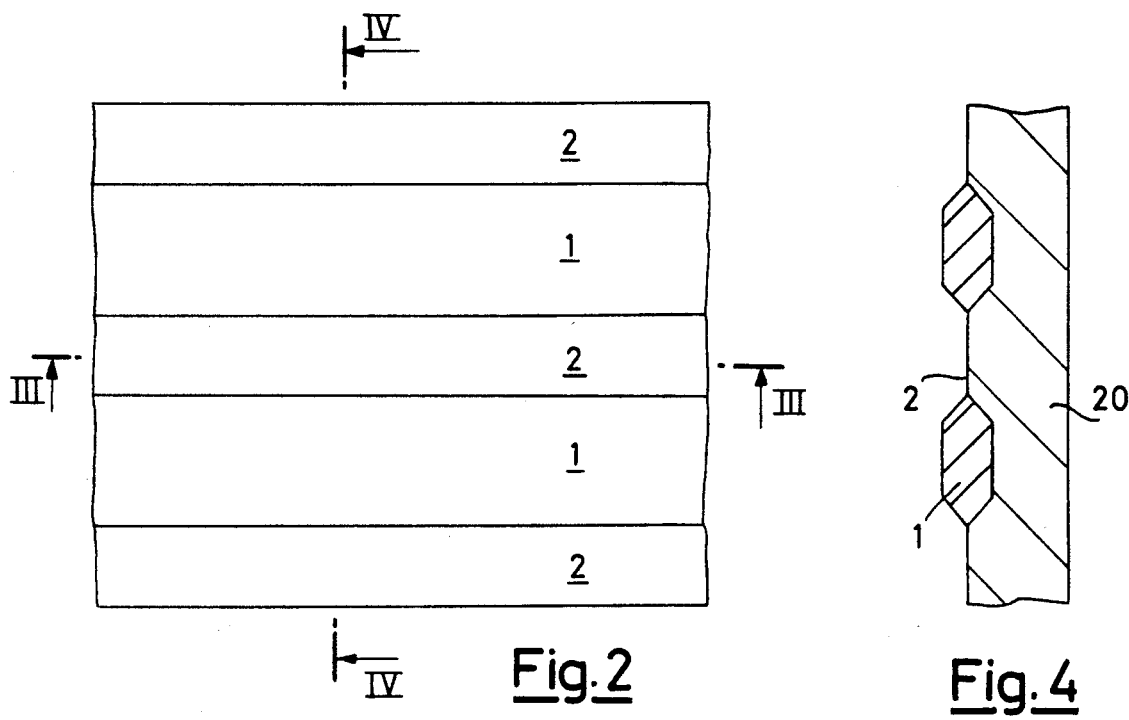
Fig.2
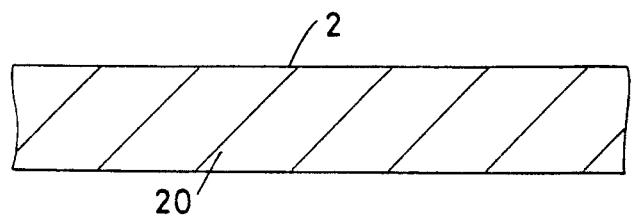
Fig.3
Fig.4

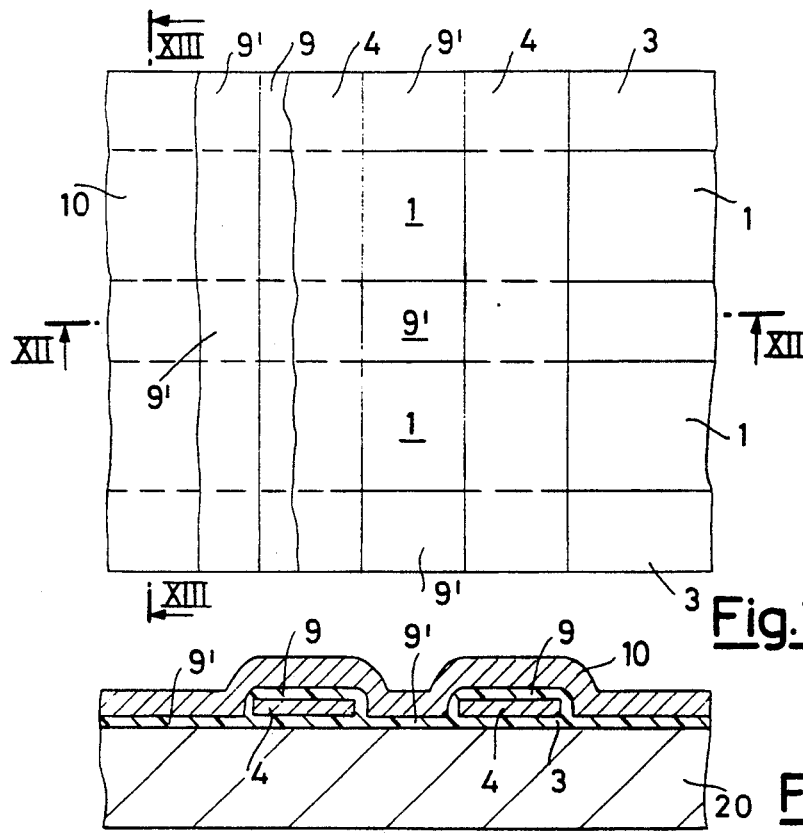
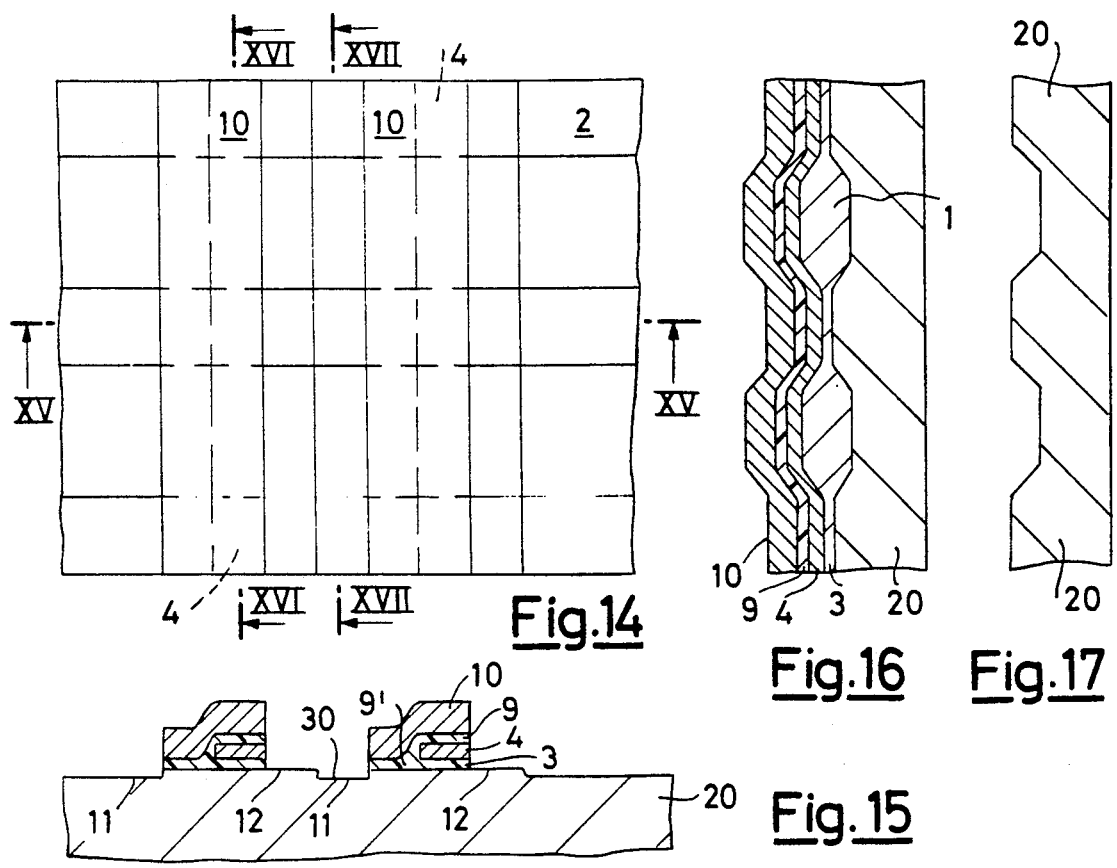

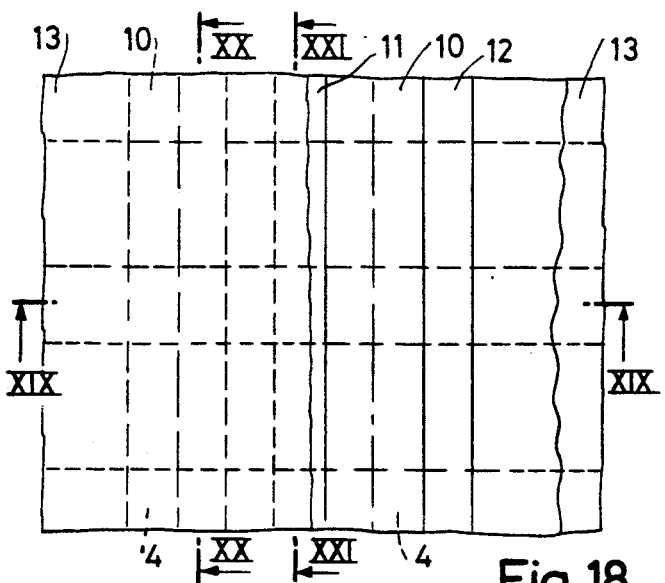
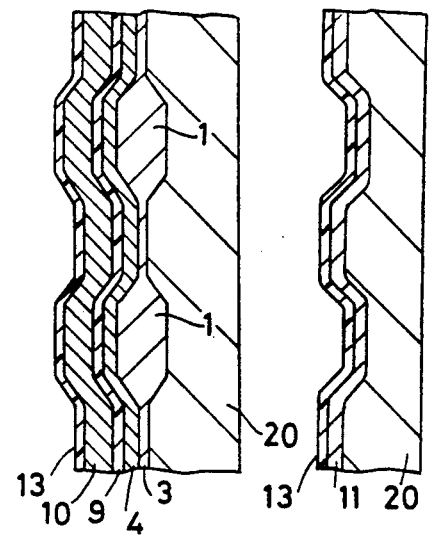
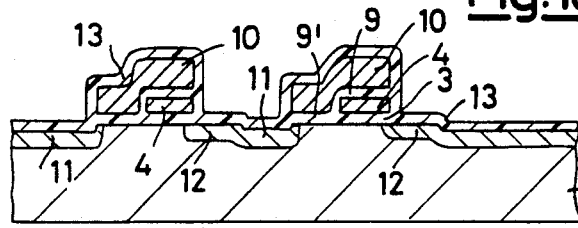
Fig. 18  Fig. 20  Fig. 21  Fig. 19
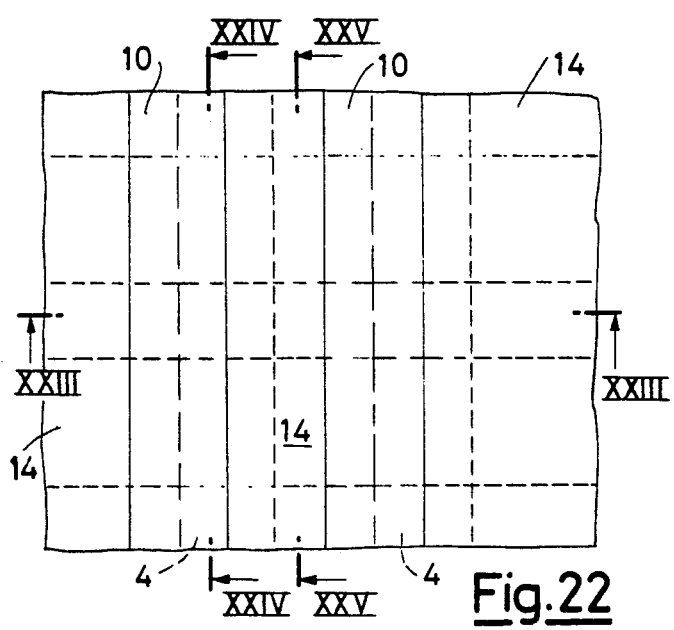
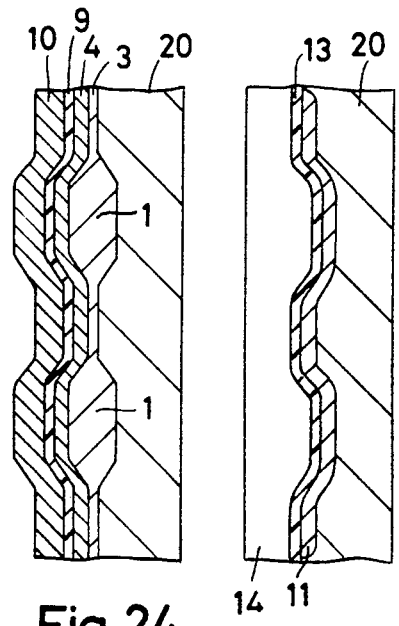
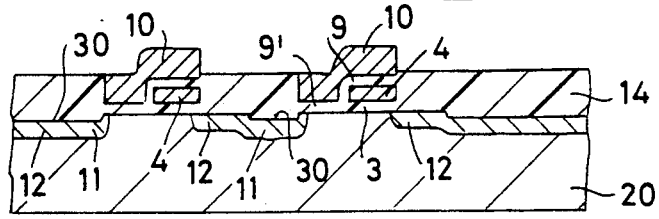
Fig. 22  Fig. 24  Fig. 25  Fig. 23

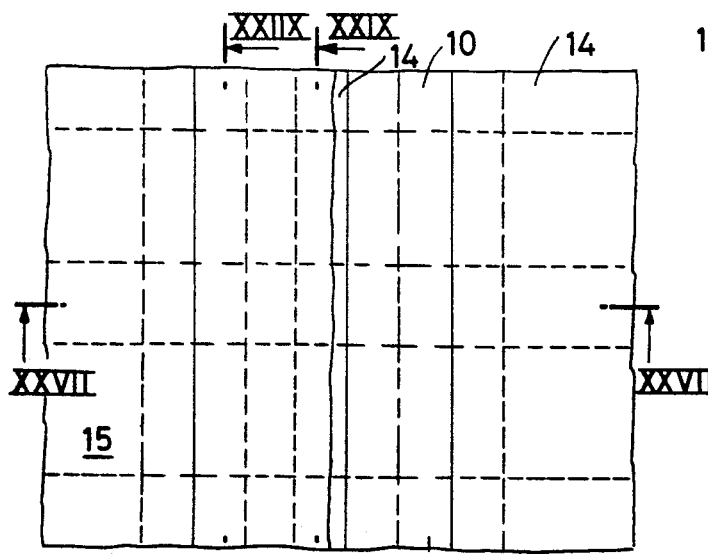
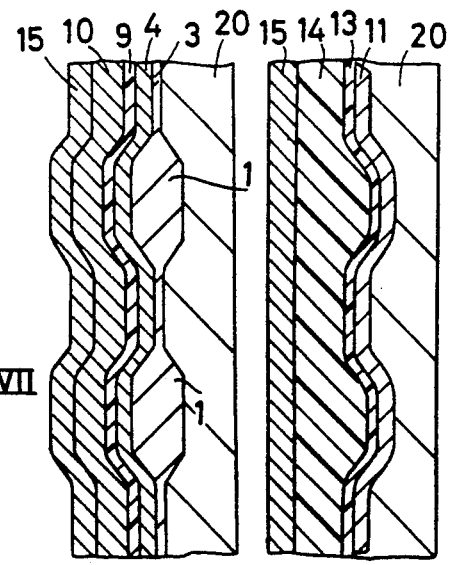
Fig.26 Fig.28 Fig.29
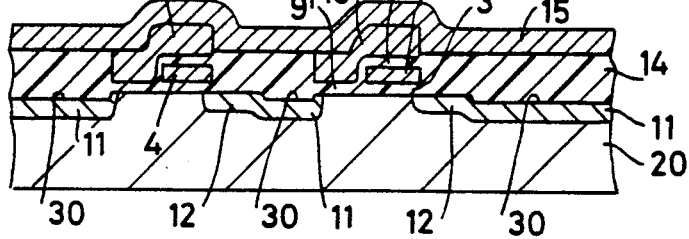
Fig.27
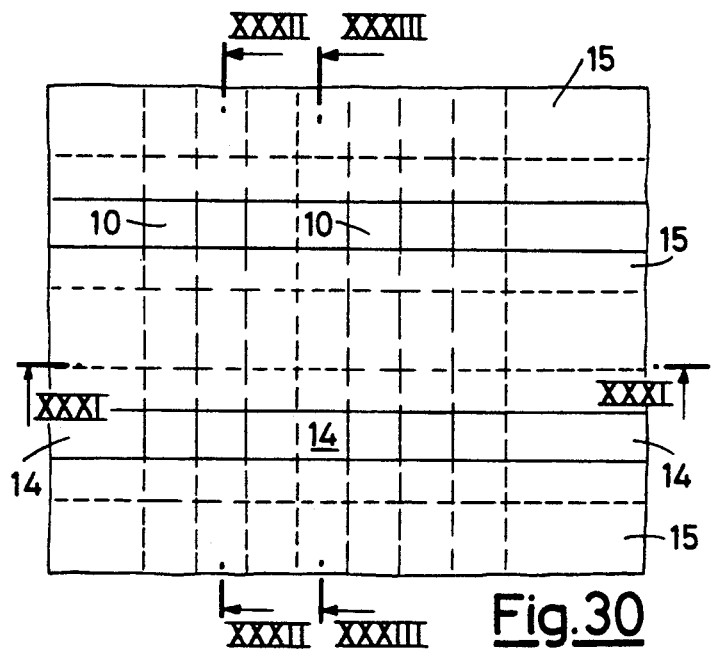
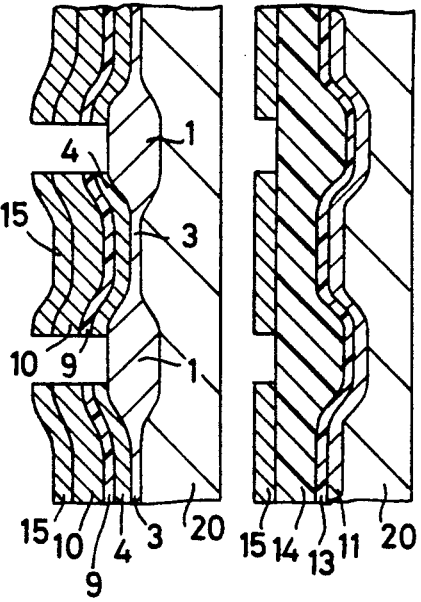
Fig.30 Fig.32 Fig.33
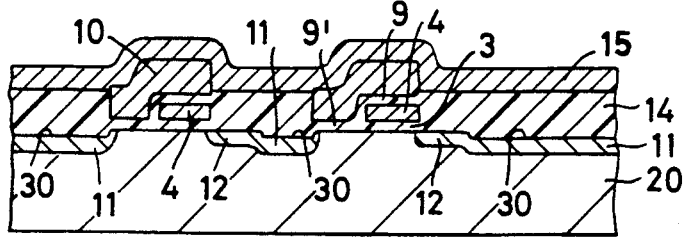
Fig.31

NON-VOLATILE SPLIT GATE EPROM MEMORY CELL AND SELF-ALIGNED FIELD INSULATION PROCESS FOR OBTAINING THE ABOVE CELL

DESCRIPTION

The present invention relates to a non-volatile split gate EPROM memory cell and self-aligned field insulation process for obtaining the above cell.

The use is known of non-volatile split gate EPROM memory cells. In such cells the floating gate does not extend along the entire channel of the cell, but only covers a part of it to form the actual memory cell. The second part of the channel is governed directly by the control gate which thus goes to form a small transistor in series with the cell itself.

A first advantage deriving from the use of the split gate memory cell consists in the fact that with such a structure the problem is highlighted of the partial raising of the floating gate voltage (with consequent current in the channel) due to the capacitive coupling between floating gate and drain (a problem known as <<drain turn-on>>), when the drain is biased at a high voltage and the control gate is grounded. In fact in a split gate cell, even in the case when the capacitive coupling between the floating gate and the drain is large, the opening of the channel is completely prevented by the presence of the transistor in series with the cell itself.

A second advantage deriving from the use of the above memory cell consists in the fact that, thanks to its asymmetry, it can be programmed starting from only one of the two diffusions (the one known as the drain, that is, that facing the floating gate). If the cell is read from the source side (that is, by raising above ground the diffusion from which writing is impossible), it is then possible to abolish completely the so-called <<soft-writing>> problem, that is, of the slow and undesired programming of the cell during its reading step.

As a result of this advantage the voltage at which the bit-line diffusion is polarised during the reading step of the cell itself can be raised with respect to the typical value used (about 1 volt), thus obtaining both an increase in the cell's reading current and a drop in the capacity of the bit-line itself.

Several types of split gate EPROM memory cells are known in the literature.

A first example of a cell of this type is described in the U.S. Pat. No. 4,328,565 and consists of a non self-aligned structure, in which the source and drain diffusions are implanted before the definition of the superimposed floating and control gates.

It follows that, for the drain diffusion to be coupled to the floating gate (that is, sufficiently superimposed over it) independently of the mis-alignments between the different masks, it is necessary to maintain a large superimposition between the floating gate itself and the drain, from which there derives a large and highly variable capacitive coupling between the latter.

During the cell's programming step this is reflected in a wide variability of the value of the voltage transferred to the floating gate and thus in a threshold jump, after the writing step, whose value is predictable with difficulty and a function of the process misalignments.

A second problem related to this cell is connected with the fact of executing the diffusion implant before growing the subsequent oxide layers of gate and interpoles. The diffusions are subjected in this way to all the heat treatments connected with these oxidation steps and they are thus deper and more diffuse. This is the opposite of the current tendency towards new generations of processes characterised by an increasingly higher density.

A last problem related to this type of cell is connected with the fact that the control gate passes over the gate and drain diffusions, it being insulated from them only by a thin layer of thermal oxide. It follows that the word-line capacity is raised with a corresponding reduction in the speed of the device.

A second example of cell of this type is described in U.S. Pat. No. 4,639,893.

In this cell the drain diffusion is self-aligned with the floating gate; the source and drain implant is executed after defining the floating gate itself and, on the drain, it is self-aligned with it. The capacitive coupling of the floating gate with the drain thus becomes independent from the process misalignments.

The distance between source and drain, on the other hand, is subject to the misalignment between the mask which defines the floating gate and that used for the source and drain implant.

As in the cell of the first example, the control gate passes completely over the source and drain diffusion and it is insulated from it only by a thin oxide thermally grown simultaneously with the gate oxide and with the interpoly one.

The greatest problem of this type of structure is precisely in this oxidation step; to lower the word-line's capacity (and thus to raise the access speed of the device) it is in fact necessary for the thin oxide to be as thick as possible, but this is not reconcilable with a good quality of the other two oxides. To obtain an appreciable difference between the thickness of these oxides it is in actual fact necessary to execute oxidation at low temperatures, but the oxides so obtained are of poor quality.

In view of this state of the art, the main object of the present invention is that of accomplishing a split gate EPROM memory cell that does not have the above drawbacks.

A further object of the present invention is that of accomplishing a process for obtaining the above cell.

According to the invention such object is attained with a non-volatile split gate EPROM memory cell, comprising a substrate with diffusions of source and drain separated by a channel area, a floating gate superimposed over a first part of said channel area and a control gate formed by a first and a second polysilicon strip, respectively, a cell gate oxide between said floating gate and said first part of the channel area, a transistor gate oxide between said control gate and a second part of the channel area, an interpoly oxide between said floating gate and said control gate and a layer of dielectric filler, characterised in that said floating gate is aligned with the drain diffusion and said control gate is aligned with said floating gate and with the diffusions of source and drain.

Again according to the invention such further object is attained through a process, characterised in that it comprises the following steps: definition of parallel strips of insulation oxide of field and active area and execution of a cell channel implant on a semiconductor substrate; growth of cell gate oxide, deposition and doping of a first layer of polysilicon and definition of both in first strips perpendicular to those of the field insulation; growth of transistor gate oxide of the transistor and of interpoly oxide, deposition and doping of a second polysilicon layer; definition of said second polysilicon layer in second strips parallel and partially superimposed over those of the first polysilicon layer; self-aligned etching of the multistrate comprising the second polysilicon layer, the transistor gate oxide, the interpoly oxide, the first polysilicon layer and the cell gate oxide up to the field insulation oxide and subsequent etching of said field oxide with uncovering of substrate strips; execution of implants of source and drain in said uncovered strips of the substrate and subsequent lateral sealing oxidation of the multistrate; filling with thick dielectric of the empty spaces between one cell and the next.

In this way there is obtained an EPROM memory cell in which the drain diffusion is self-aligned with the floating gate and with the control gate, in turn self-aligned with one another, and the source diffusion is self-aligned with the control gate, and wherein the distance between the source and drain diffusions is determined by the width of the mask defining the control gate and is thus independent of the misalignment between the masks. In addition the source and drain junctions are not very diffused as they are not subjected to any of the oxidation heat treatments for the formation of the gate oxide and of the interpoly oxide.

Moreover, in this cell, the presence of a thick dielectric allows the word-line, constituted by a third series of polysilicon or silicide strips perpendicular to those defining the control and floating gates, to be arranged very high up, thus avoiding the problem of the triple oxidation and of the high coupling capacity between the gates and the source and drain diffusions.

Finally the self-alignment of the field insulation with the control gate allows the cells to be packed into a matrix in a periodic structure having a so-called <<tablecloth>> pattern in which it is not necessary to have a drain contact for each pair of cells.

The features of the present invention shall be made more evident by the following detailed description of an embodiment illustrated as a non-limiting example in the enclosed drawings, wherein:

FIG. 1 shows a vertical sectional view of a pair of cells according to the invention;

FIGS. 2-4 show a top plan view and a sectional view, taken along the lines III—III and IV—IV of FIG. 2, respectively, of the initial step of the process for manufacturing the cells of FIG. 1;

Figure 5:
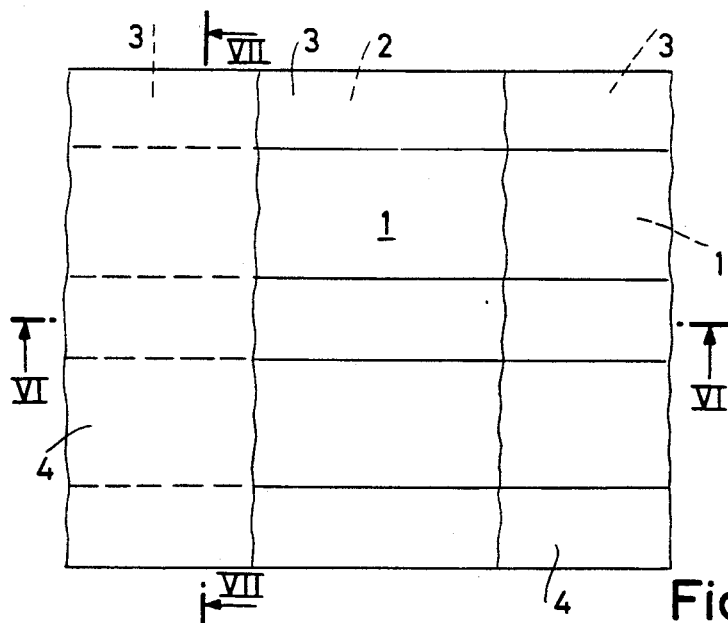

FIGS. 5-7, 8-10, 11-13, 14-16, 17-19, 20-22, 23-25, 26-29 and 30-33, with views similar to those of FIGS. 2-4, show in turn subsequent steps of the above process.

With reference to FIG. 1, each cell 30 comprises a semiconductor substrate 20 in which there are obtained diffusions of source 11 and drain 12 essentially of the type n+, between which there is a channel formed by adjacent portions 7, 8, preferably doped in a different way. Over the portions 8 and 7 there are superimposed a layer of cell gate oxide 3 and a transistor oxide layer 9', respectively. Over oxide 3 there is in turn superimposed a first polysilicon strip (perpendicular to the plane of the drawing) constituting a floating gate 4, over which there is an interpoly oxide 9 similar to the transistor oxide 9'. Over oxides 9 and 9' there is arranged a second polysilicon strip constituting a control gate 10. As shown, the floating gate 4 is aligned with the drain diffusion 12 and the control gate 10 is aligned with one edge of the floating gate 4 and with the source and drain diffusions 11 and 12.

A dielectric 14 is used for sealing the spaces present between one cell and the other and lastly a further polysilicon or silicide strip 15, constituting a connection word-line between cells, extends perpendicularly to the gate strips 4 and 10.

With reference to FIGS. 2-28, the process according to the invention for the accomplishment of the pair of cells 30 of FIG. 1 comprises a first step in which on the silicon substrate 20 there are defined parallel insulations strips of field 1 and of active area 2 (FIGS. 2-4). During such step there is also executed the channel implant of the cell (portions 8 and 7 of FIG. 1), necessary for defining the threshold voltage.

Figure 7:
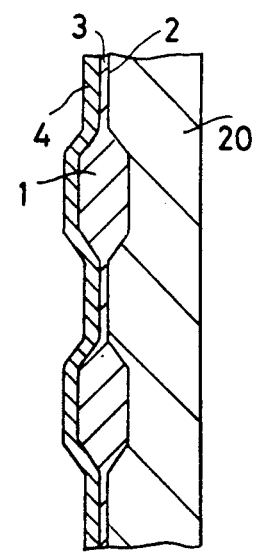
Figure 6:
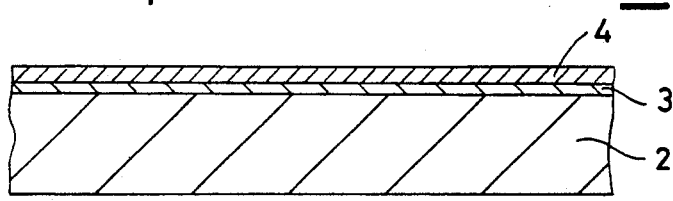

With reference to FIGS. 5-7, there is then executed a growth of cell gate oxide 3 and the subsequent deposition of a layer of polysilicon 4. The layer of polysilicon 4 is made conductive (doped) using conventional techniques.

Figure 8:
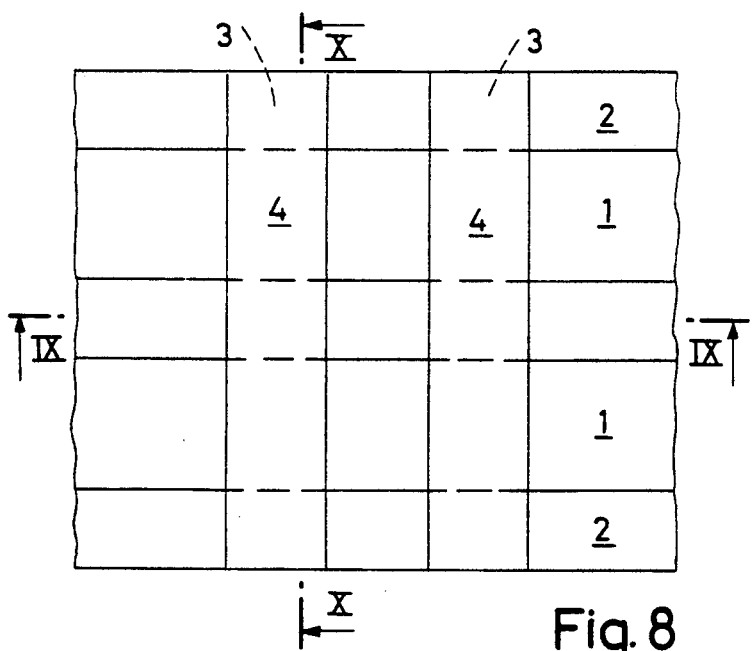
Figure 10:
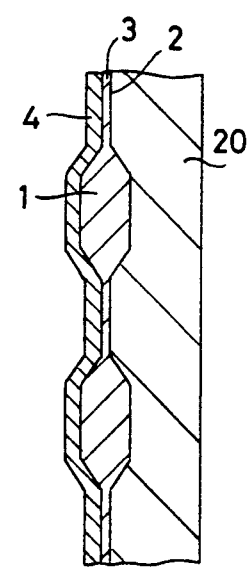
Figure 9:
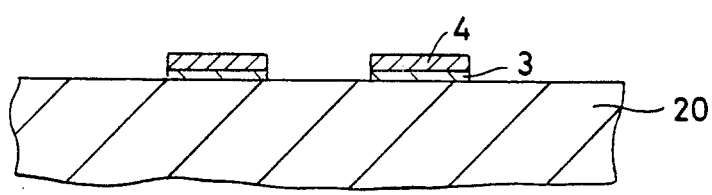

With reference to FIGS. 8-10, the double layer of cell gate oxide 3 and polysilicon 4 is defined in strips perpendicular to the field oxide strips 1. After etching the polysilicon layer 4 and of the cell gate oxide 3, there may be executed, if necessary, an implant of transistor channel (portion 7 of FIG. 1), whose object is to define the threshold of the transistor in series with the cell; in this way, as shown in FIG. 1, the channel doping in the portion of channel 7 directly controlled by the control gate 10 is differentiated with respect to that in the portion of channel 8 under the floating gate 4.

With reference to FIGS. 11-13, the growth is executed of transistor gate oxide 9' and of interpoly oxide 9, over which there is deposited and made conductive a second layer of polysilicon 10 which shall constitute the control gate.

With reference to FIGS. 14-17, there is first accomplished the definition of a second layer of polysilicon 10 in strips that are parallel and partially superimposed over those of the first layer 4 and then the self-aligned etching of the multilayer constituted by the first and second layer of polysilicon 4, 10, by the interpoly oxide 9 and by the gate oxides 9' and 3 according to strips parallel to one another and perpendicular to the strips related to the field oxide 1 and to the active regions 2. With subsequent etching of the field oxide 1 there are uncovered side-by-side regions of source 11 and drain 12, constituting the bit-lines, aligned with the control gate 10 and with the floating gate 14, respectively. During the etching of the first layer of polysilicon 4 the cell's asymmetry (FIG. 15) determines the creation of small excavations 30 in the silicon substrate 20 in the source areas 11.

With reference to FIGS. 18-21, there is executed an n+ implant in the regions of source 11 and of drain 12, after which a lateral sealing takes place with oxide 13 of the multistrate 3, 4, 9, 10.

With reference to FIGS. 22-25, the planarisation is executed, that is, the filling with dielectric 14 of the spaces between the cells 30. Typically, planarisation is executed by depositing a layer of deposed oxide and subsequently a layer of <<spin-on-glass>> (or resit) whose object is to make the surface planar.

Planarisation is completed by partially removing the dielectric 14 and the covering oxide 13 over the second layer of polysilicon 10, so that the polysilicon surfaces 10 are not covered with oxide and may thus be contacted.

With reference to FIGS. 26-29, there is executed the deposition of a conductive layer 15, typically polysilicon or silicide, which shall constitute the word-lines.

With reference to FIGS. 30-33, the self-aligned etching is executed of the multistrate 3, 4, 9, 10, 15 up to the field oxide 1, according to strips which are parallel to, but wider than, the active area strips 2, so as to obtain cells with lateral fins superimposed over the field oxide 1 (FIG. 32). In this way the fins of one cell are separated from those of the contiguous cell.

The steps of the standard process which follow, in particular the sealing reoxidation, the deposition of intermediate dielectric, the opening of the contacts and the metallisation, are not described here.

I claim:

1. A non-volatile split gate EPROM memory cell, comprising:
   a substrate with diffusions of source and drain separated by a channel area;
   a floating gate superimposed over a first part of said channel area;
   a control gate formed by first and a second polysilicon strips, respectively;
   a cell gate oxide between said floating gate and said first part of the channel area;
   an interpoly oxide between said floating gate and said control gate; and
   a layer of dielectric filler located to seal spaces present between the cell and an adjacent cell;
   wherein said floating gate is aligned with the drain diffusion and said control gate is self-aligned with said floating gate and with the diffusions of source and drain.

2. The cell of claim 1, further comprising a field oxide region self-aligned with the floating and control gates, the width of said field oxide region being determined by the second polysilicon strip.

3. The cell of claim 1, further comprising a field oxide region and wherein the floating gate has lateral fins superimposed over the field oxide region so as to increase capacitive coupling with the control gate.

4. The cell of claim 1, further comprising a strip of conductor material superimposed over and in contact with said second polysilicon strip for making an electrical connection with adjacent cells, said strip of conductor material being separated from said diffusions of source and drain by said dielectric layer so as to reduce capacitive coupling with said diffusions.

* * * * *